United States Patent
Bains

(10) Patent No.: US 7,221,609 B1
(45) Date of Patent: May 22, 2007

(54) FINE GRANULARITY DRAM REFRESH

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/321,367

(22) Filed: Dec. 28, 2005

(51) Int. Cl.
*G11C 7/00* (2006.01)

(52) U.S. Cl. ............... 365/222; 365/236; 365/239

(58) Field of Classification Search ........ 365/222, 365/236, 239
See application file for complete search history.

(56) References Cited

U.S. PATENT DOCUMENTS

| | | | | |
|---|---|---|---|---|
| 4,984,209 A | * | 1/1991 | Rajaram et al. | 365/222 |
| 5,703,823 A | * | 12/1997 | Douse et al. | 365/222 |
| 6,415,353 B1 | * | 7/2002 | Leung | 711/106 |
| 7,042,785 B2 | * | 5/2006 | Kim | 365/222 |

* cited by examiner

Primary Examiner—Tuan T. Nguyen
(74) Attorney, Agent, or Firm—Derek J. Reynolds

(57) ABSTRACT

A method, device, and system are included. In one embodiment, the method included issuing a single row refresh command for a first row in a memory starting at a target address, incrementing a row counter, continuing issuing a single row refresh command for each subsequent row in the memory and incrementing the row counter until the number of row counter increments is equal to the number of rows of the memory refreshed as a result of a refresh (REF) command.

23 Claims, 4 Drawing Sheets

FINE GRANULARITY DRAM REFRESH

FIELD OF THE INVENTION

The invention relates to computer system memory. More specifically, the invention relates to memory refresh cycles.

BACKGROUND OF THE INVENTION

Each memory cell in a dynamic random access memory (DRAM) is constructed from a single transistor and a single capacitor and is called dynamic because its data decays and become invalid due to various leakage current paths to surrounding cells and to the substrate the DRAM resides upon. To keep the data in the cells of any DRAM valid, each memory cell is periodically refreshed. Data in the DRAM cell array is refreshed every time it is read out of the cell array into the sense amplifiers and subsequently rewritten into the cell. The memory controller is responsible for periodically performing refresh maintenance operations on the memory cell array. Every row of the memory array needs to be refreshed before the data in the row decays to an invalid state.

As the densities and the page sizes of DRAM grow, it takes significantly more power and time to perform a refresh on the entire memory cell array. With increasing densities, DRAM devices are internally refreshing more rows per refresh command to keep the refresh interval constant, which results in significant power peaks during a given refresh operation. Furthermore, when DRAM is being refreshed, it can't perform normal read and write operations and is effectively locked out from normal operating mode. Thus, with multiple rows refreshed per refresh command, the lockout period has been increasing. The increasing lockout period increases refresh latencies and, as a result, lowers the bandwidth that can be guaranteed for isochronous traffic.

BRIEF DESCRIPTION OF THE DRAWINGS

The present invention is illustrated by way of example and is not limited by the figures of the accompanying drawings, in which like references indicate similar elements, and in which.

DETAILED DESCRIPTION OF THE INVENTION

Embodiments of a method, device, and system for a fine granularity DRAM refresh are disclosed. In the following description, numerous specific details are set forth. However, it is understood that embodiments may be practiced without these specific details. In other instances, well-known elements, specifications, and protocols have not been discussed in detail in order to avoid obscuring the present invention.

Figure 1:
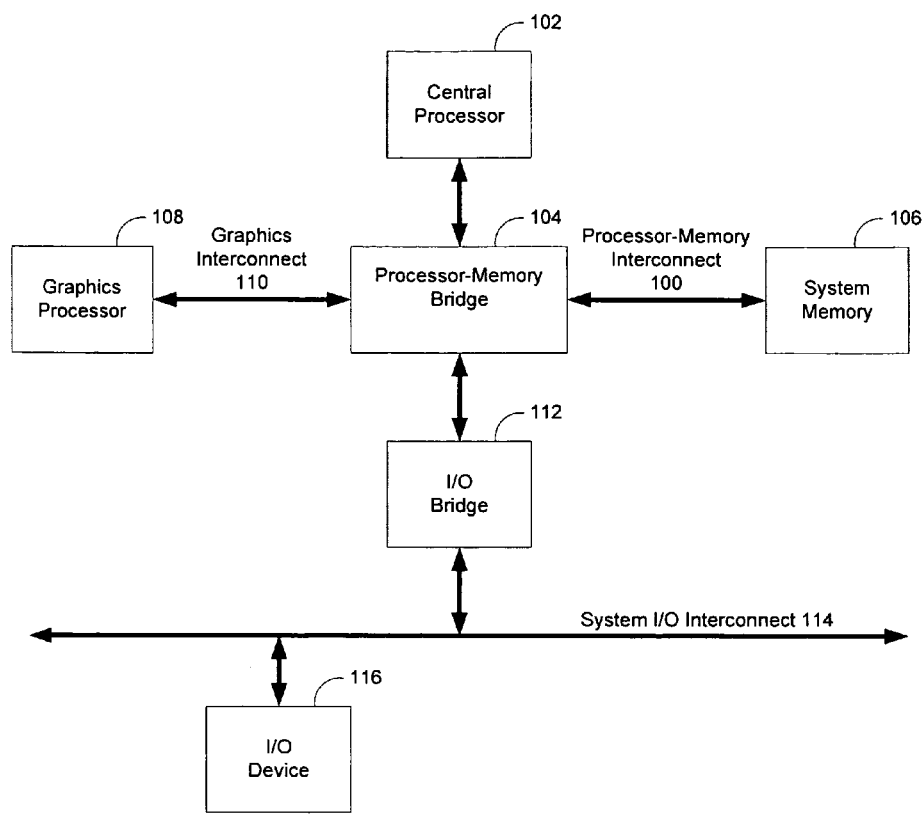
FIG. 1 is a block diagram of a computer system which may be used with embodiments of the present invention.

FIG. 1 is a block diagram of a computer system which may be used with embodiments of the present invention. The computer system comprises a processor-memory interconnect 100 for communication between different agents coupled to interconnect 100, such as processors, bridges, memory devices, etc. Processor-memory interconnect 100 includes specific interconnect lines that send arbitration, address, data, and control information (not shown). In one embodiment, a central processor 102 is coupled to processor-memory interconnect 100 through processor-memory bridge 104. In another embodiment, there are multiple central processors coupled to processor-memory interconnect (multiple processors are not shown in this figure).

Processor-memory interconnect 100 provides central processor 102 and other devices access to the memory subsystem. In one embodiment, a memory controller to control access to system memory 106 is located on the same chip as processor-memory bridge 104. In another embodiment, the memory controller is located on the same chip as central processor 102. Information, instructions, and other data may be stored in system memory 110 for use by central processor 102, as well as many other potential devices. In one embodiment, a graphics processor 108 is coupled to processor-memory bridge 104 through a graphics interconnect 110.

I/O devices, such as I/O device 116, are coupled to system I/O interconnect 114 and to processor-memory interconnect 100 through I/O bridge 112 and processor-memory bridge 104. In different embodiments, I/O device 116 could be a network interface card, an audio device, or one of many other I/O devices. I/O Bridge 112 is coupled to processor-memory interconnect 100 (through processor-memory bridge 104) and system I/O interconnect 114 to provide an interface for a device on one interconnect to communicate with a device on the other interconnect.

In one embodiment, system memory 106 consists of dynamic random access memory (DRAM). In one embodiment, the DRAM is located on a direct inline memory module (DIMM). In different embodiments, the DIMM may have double data rate (DDR) DRAM, DDR2 DRAM, or any other of a number of types of dynamic memories. In one embodiment, there is only one DIMM module residing in the system. In another embodiment, there are multiple DIMM modules residing in the system.

Figure 2:
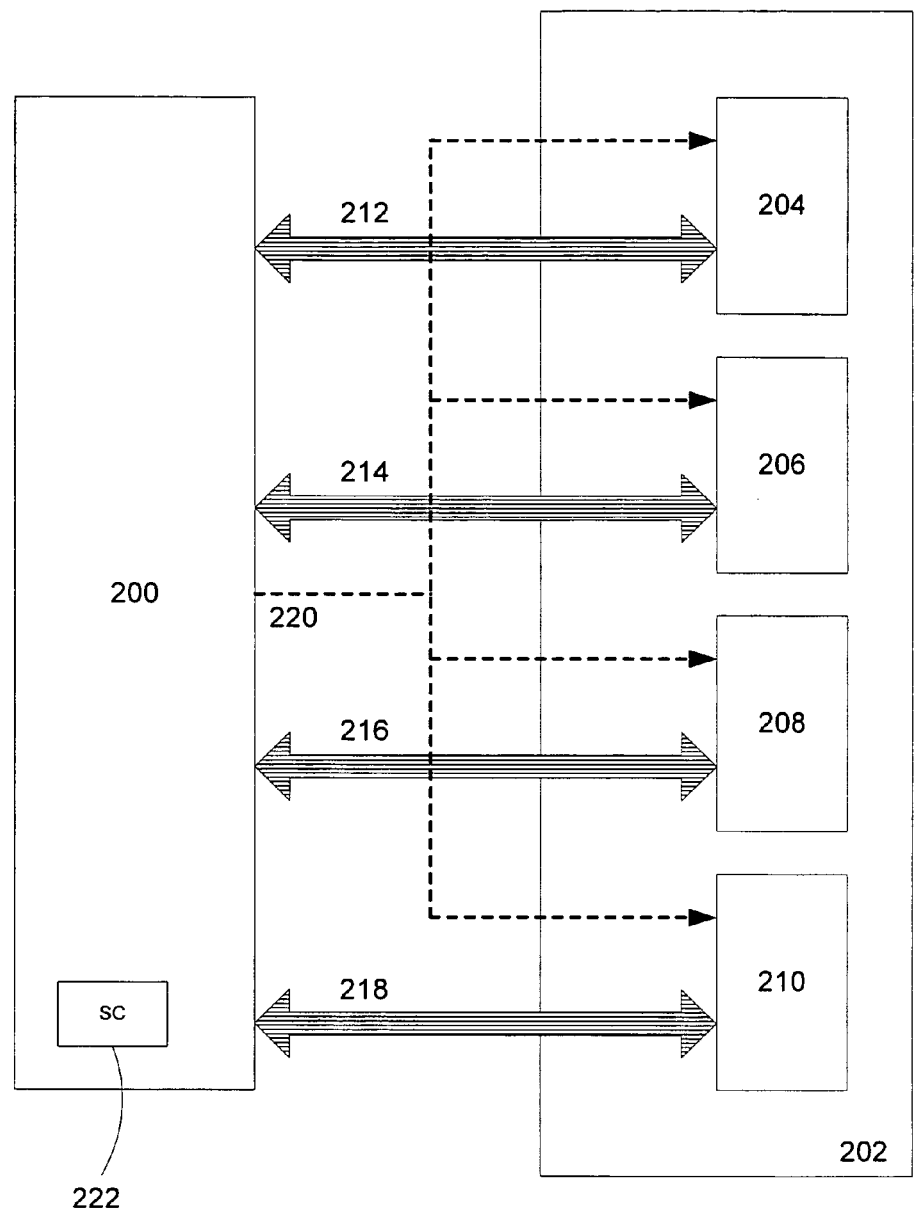
FIG. 2 illustrates one embodiment of a layout of circuitry and interconnect lines between a DRAM DIMM and a memory controller.

Now turning to the next figure, FIG. 2 illustrates one embodiment of a layout of circuitry and interconnect lines between a DRAM DIMM and a memory controller. In one embodiment, a memory controller 200 is coupled to a DIMM module 202. The DIMM module has 4 discrete memory devices located on it: devices 204, 206, 208, and 210. In different embodiments, there may be 2, 4, 8, 16, or more discrete memory devices located on a single DIMM. Although FIG. 2 shows a single DIMM, in different embodiments, there may be two or more DIMMs in a memory subsystem. In this embodiment, each memory device has address and data inputs as well as data outputs. The data interconnect lines are represented by arrows 212, 214, 216, and 218. The width of these data interconnects will vary based on the particular memory involved. For example, in one embodiment, each data interconnect is 16 bits wide. The address lines are represented by dotted line 220. In different embodiments, there are additional lines coupled to each module, such as clock phase lock loop (PLL) lines, command lines, and others, which have not been shown to avoid obscuring the present invention. Row latch and decode and column decode information is sent from the memory controller 200 to the memory devices on the address interconnect line(s) 220.

In one embodiment, when the memory controller receives a memory request, it sends address information out on the address interconnect line(s) to target a specific location within one or more memory devices. To send this information, an Activate (ACT) command is issued, which opens up a specific row of memory by sending the corresponding row and column address information out on the respective address interconnect lines as described above. Once the specific row in memory is activated, it can be read from, written to, etc. In one embodiment, if a write command has been issued, the data is sent over data interconnect lines 212, 214, 216, and 218. In another embodiment, if a read command has been issued, the data is retrieved from the row(s) in memory via the data interconnect lines 212, 214, 216, and 218. Regardless, when the read or write operation is complete, the data is restored in the target row address location in memory by precharging the row with a Precharge (PRE) command. All individual bits in the row of DRAM memory are stored by using a transistor and a capacitor (this circuitry can be referred to as a cell). The PRE command charges the capacitors in a row of memory to preserve the stored data. Data decay due to current leakage in each cell requires frequent ACT and PRE operations to refresh the data in the entire memory even if there are no read or write operations taking place. As a result of the increasing size of memory, DRAM refresh operations have increased in scope. In lieu of individual ACT and PRE commands being issued for each row of memory, current DRAMs utilize a refresh (REF) command that performs a refresh to multiple rows of memory.

For example, currently in a standard DRAM, a REF command may refresh four or eight rows of memory at a time. Depending on the DRAM utilized, during the refresh cycle, the bank of memory (including the particular page and the individual rows targeted) or the entire bank group, which includes multiple banks, is locked and unable to conduct normal read and write operations. This mandatory lockout period creates increased memory latencies during refresh cycles. The more rows that are refreshed per REF command, the longer the latency. The lockout period is significantly shorter when DRAM row refreshes are not combined but rather when an explicit ACT/PRE command pair is issued for an individual row of memory. Using ACT/PRE command pairs in lieu of the REF command, the memory can perform normal read and write operations between each ACT/PRE command pair (i.e., between each individual row refresh), instead of only after four or after eight rows have been refreshed. This finer granularity refresh allows for less continuous lockout periods and potentially lower memory latencies as a result. Additionally, by allowing for memory accesses between individual row refreshes, this potentially reduces peak power consumption spikes associated with consecutive row refreshes.

Table 1 illustrates the discrepancy with estimated latencies on current DRAMs. The tRFC and tRC parameters are the lockout period parameters. Even if it would be desirable to refresh a single row of memory, using the REF command this is impossible. Therefore, tRFC is the time that memory is locked out from standard read/write operations during a REF command refresh cycle for any given row of memory. This lockout period depends on the number of rows refreshed when a REF command is issued. The number of rows refreshed per REF command usually depends on the density of the DRAM. For example, in one embodiment, a REF command for a 2 Gbit DRAM device refreshes four rows of memory. In another embodiment, a REF command for a 4 Gbit DRAM device refreshes eight rows of memory.

Additionally, this lockout period may change based on DRAM technologies such as row and column access times. Alternatively, tRC is the time that memory is locked out from standard read/write operations during an explicit ACT/PRE command pair refresh cycle for a single row of memory. This lockout period is not dependent on the density of DRAM (regarding the number of rows refreshed during a REF command). Rather, tRC is only dependent on DRAM technology for row and column clock timings. Though, in regard to DRAM technology timings, both tRC and tRFC would increase and decrease in unison. Thus, the primary factor affecting the discrepancy between the tRC and tRFC lockout periods is the number of rows refreshed during a REF command.

| Timing Parameter | Explanation | Lockout Period |
|---|---|---|
| tRFC | Time of lockout period to complete a refresh for a given row of memory with REF command. | 2 Gbit device: ~180 ns<br>4 Gbit device: ~360 ns |
| tRC | Time of lockout period to complete a refresh of a single row of memory with explicit ACT/PRE commands. | ~45 ns |

Returning to FIG. 2, in one embodiment, memory controller 200 issues explicit ACT–PRE command pairs in lieu of the REF command to perform the REF operation. In one embodiment, memory controller 200 computes the number of rows to be refreshed in lieu of each REF command based on the memory size per rank, number of banks, and the DRAM page size. In one embodiment, this computation is done at system power on when memory is sized and the serial presence detect (SPD) electronic programmable read only memory (EPROM) is read.

In one embodiment, the controller does not keep track of the row address for refreshes. Rather, a refresh counter (RCT), located on either the DIMM module 202 or within each memory device 204, 206, 208, and 210 keeps track of the next row to be refreshed. Based on current DRAM module technology, this counter tracks rows based on the REF command. In one embodiment, a new command, ACT_R, is defined and utilized in the memory controller in lieu of the original ACT command. This allows the address stored in the DRAM to be utilized separately and not affected by the ACT_R–PRE command pair refresh. In one embodiment, when a DRAM module, such as DRAM module 202, receives the ACT_R command, it activates the next row that had to be refreshed based its internal refresh counter for the corresponding bank. The bank address is provided by memory controller 200 as part of ACT_R command, assuming the refresh is done per bank.

In one embodiment, the memory controller 200, after issuing the first ACT_R and PRE pair, is required to commit to refreshing all the rows that a single REF command would have refreshed. In one embodiment, separate sub counter circuitry (SC) 222 within the memory controller 200 is utilized to increment the RCT within the DRAM modules by one when all ACT_R commands have been received in lieu of a single REF command. This allows the DRAM module to maintain an accurate count of refreshed rows and an accurate location of the next row to be refreshed using the original RCT counter.

In one embodiment, the command sequence to replace a single REF command in the case where four rows have to be refreshed is as follows:

REF=ACT_R, PRE, ACT_R, PRE, ACT_R, PRE, ACT_R, PRE

To internally keep track of memory refreshes, in one embodiment, the memory controller 200 counts the four activates as a single refresh. In another embodiment, the controller can utilize a mix of REF commands and explicit ACT_R-PRE commands to refresh the memory.

Figure 3:
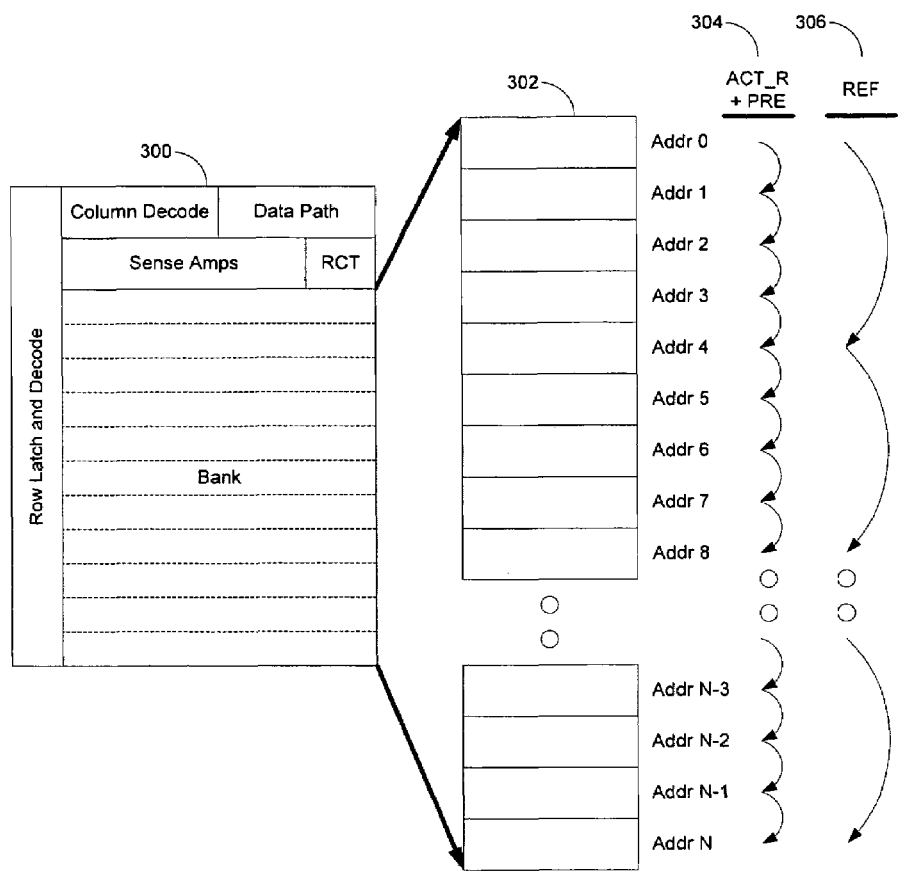
FIG. 3 illustrates one embodiment of a lessened DRAM lockout period as a result of refreshing single rows of memory.

Now turning to the next figure, FIG. 3 illustrates one embodiment of a lessened DRAM lockout period as a result of refreshing single rows of memory. In one embodiment, a DRAM device (or bank) 300 is shown including row latch and decode circuitry, column decode circuitry, data path sending and receiving circuitry, sense amps, as well as the actual memory bank of individual memory cells. In one embodiment, the memory bank is made up of many rows of memory 302. Each of the memory rows 302 have an address (Addr 0–N in FIG. 3). If a row of memory is refreshed, there is a tRC lockout time (as described in Table 1 above) that is the sum of a tRAS time (the amount of time after an ACT command is issued before a PRE command can be issued) and a tRP time (row precharge time). This ACT+PRE command 304 is issued to each row address (Addr 0, Addr 1, etc). Alternatively, when a REF command 306 is issued, in this embodiment it is issued once every four rows (Addr 0, Addr 4, Addr 8). The amount of time for an individual row to refresh is standard regardless of whether the ACT+PRE command pair is issued or the REF command is issued. In this embodiment, the lockout time of a REF command is therefore 4× the lockout time of the ACT+PRE command pair.

In one embodiment, the ACT_R+PRE command pairs can be interspersed amongst REF commands. Thus, in this embodiment, based on the needs of the system, at a certain time REF commands may be utilized, and then ACT_R+PRE pairs can be utilized at another point in time. In one embodiment, the change is dynamic and based on a predetermined temperature threshold in the computer system. For example, in one embodiment, the junction temperature of the chipset northbridge die may have a threshold temperature. If the temperature is below the threshold, the REF commands are implemented. If the temperature reaches or exceeds the threshold, logic within the computer system could dynamically change the refresh cycles to utilize the ACT_R+PRE pairs to lessen any refresh cycle power (and subsequent temperature) spikes. In different embodiments, the threshold temperature can be measured from a specific chip junction temperature in the system, an ambient temperature in the system, or any one or more other possible computer system temperature readouts. In another embodiment, the threshold is performance-based instead of temperature based. In this embodiment, if a certain bandwidth threshold is reach while measuring data throughput, the REF commands are replaced by the ACT_R+PRE command sets during refreshes (to maximize performance and minimize latency).

Figure 4:
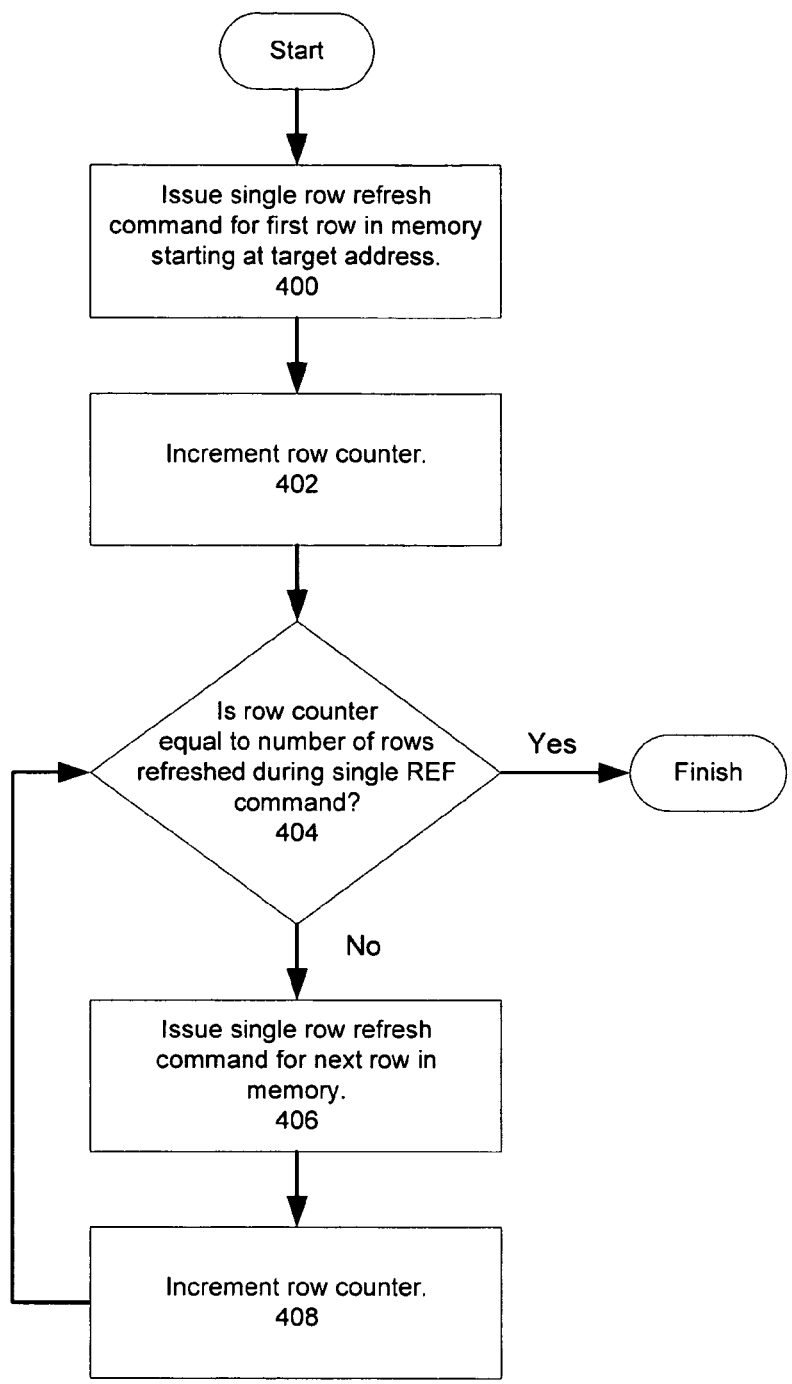
FIG. 4 is a flow diagram of an embodiment of a method to achieve lower memory latency during a DRAM refresh.

Now turning to the next figure, FIG. 4 is a flow diagram of an embodiment of a method to achieve lower memory latency during a DRAM refresh. The process is performed by processing logic that may comprise hardware (circuitry, dedicated logic, etc.), software (such as is run on a general purpose computer system or a dedicated machine), or a combination of both. The low latency DRAM refresh process begins by processing logic issuing a single row refresh command for a first row in a memory starting at a target address (processing block 400). In one embodiment, the memory refers to DRAM. Additionally, in one embodiment, the single row refresh command is an ACT_R-PRE command pair as described above in regard to FIG. 2. Next, processing logic increments a row counter (processing block 402). Then processing logic determines whether the row counter is equal to the number of rows that are refreshed in the memory as a result of a refresh (REF) command (processing block 404). If the row counter does equal the number of rows refreshed as a result of a REF command, then the process is finished. Otherwise, processing logic issues another single row refresh command for the next row in the memory (processing block 406). Then processing logic increments the row counter again (block 408) and the comparison block 404 is repeated. In one embodiment, this completed process is equivalent to a DRAM refresh cycle that is executed as a result of a REF command. The row counter in this process allows processing logic to keep track of how many individual rows have been refreshed so it can be determined when enough iterations have taken place to equal what would have taken place during a REF command. In one embodiment, the row counter referred to in this process is logic contained within the memory. In another embodiment, the row counter referred to in this process is logic contained within the memory controller issuing this process to the memory. Thus, embodiments of a method, device, and system for a fine granularity DRAM refresh are disclosed. These embodiments have been described with reference to specific exemplary embodiments thereof. Though, the device, method, and system may be implemented with any given protocol with any number of layers. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A method, comprising:
   issuing a single row refresh command for a first row in a memory starting at a target address;
   incrementing a row counter;
   continuing to issue a single row refresh command for each subsequent row in the memory and incrementing the row counter until the number of row counter increments is equal to the number of rows of the memory refreshed as a result of a refresh (REF) command.

2. The method of claim 1, further comprising allowing one or more memory access requests to access the memory after each single row refresh command.

3. The method of claim 2, wherein memory access requests include memory read commands and memory write commands.

4. The method of claim 1, wherein a single row refresh command further comprises a single row activate (ACT_R) command followed by a precharge (PRE) command.

5. The method of claim 1, further comprising resetting the row counter to zero after every row of memory targeted by the REF command has been issued a single row refresh command.

6. The method of claim 5, further comprising incrementing a REF counter each time the row counter resets.

7. The method of claim 1, further comprising dynamically changing between using a REF command for memory refresh cycles and issuing a single row refresh for memory refresh cycles.

8. The method of claim 7, further comprising:
   issuing single row memory refreshes when a temperature within a computer system is at or above a threshold temperature; and issuing REF command memory refreshes when the temperature within the computer system is below the threshold temperature.

9. The method of claim 7, further comprising:

issuing single row memory refreshes when the data throughput of a memory bus is greater than or equal to a threshold bandwidth; and issuing REF command memory refreshes when the data throughput of a memory bus is less than a threshold bandwidth.

10. A memory controller device, comprising circuitry to:

issue a single row refresh command for a first row in a memory starting at a target address;

increment a row counter;

continue to issue a single row refresh command for each subsequent row in the memory and to increment the row counter until the number of row counter increments is equal to the number of rows of the memory refreshed as a result of a refresh (REF) command.

11. The memory controller device of claim 10, further comprising circuitry to allow one or more memory access requests to access the memory after each single row refresh command.

12. The memory controller device of claim 11, wherein memory access requests include memory read commands and memory write commands.

13. The memory controller device of claim 10, wherein a single row refresh command further comprises a single row activate (ACT_R) command followed by a precharge (PRE) command.

14. The memory controller device of claim 10, further comprising circuitry to reset the row counter to zero after every row of memory targeted by the REF command has been issued a single row refresh command.

15. The memory controller device of claim 14, further comprising circuitry to increment a REF counter each time the row counter resets.

16. The memory controller device of claim 10, further comprising circuitry to determine the number of rows of the memory that are refreshed as a result of the REF command when the device is powered on.

17. A system, comprising:

a bus;

a processor coupled to the bus;

a memory coupled to the bus;

a network interface card coupled to the bus; and a memory controller device coupled to the bus, the memory controller device comprising circuitry to:

issue a single row refresh command for a first row in a memory starting at a target address;

increment a row counter;

continue to issue a single row refresh command for each subsequent row in the memory and to increment the row counter until the number of row counter increments is equal to the number of rows of the memory refreshed as a result of the a refresh (REF) command.

18. The system of claim 17, wherein the memory controller device allows one or more memory access requests to access the memory after each single row refresh command.

19. The system of claim 18, wherein memory access requests include memory read commands and memory write commands.

20. The system of claim 17, wherein a single row refresh command further comprises a single row activate (ACT_R) command followed by a precharge (PRE) command.

21. The system of claim 17, wherein the memory controller device resets the row counter to zero after every row of memory targeted by the REF command has been issued a single row refresh command.

22. The system of claim 21, wherein the memory controller device increments a REF counter each time the row counter resets.

23. The system of claim 17, wherein the memory comprises dynamic random access memory (DRAM).

* * * * *